United States Patent [19]
Huisken et al.

[11] Patent Number: 5,862,189
[45] Date of Patent: Jan. 19, 1999

[54] DE-INTERLEAVING AND BUFFERING IN ONE MEMORY

[75] Inventors: Josephus A. Huisken, Eindhoven, Netherlands; Antoine Delaruelle, Kasterlee, Belgium; Franciscus A. M. Van De Laar, Eindhoven, Netherlands

[73] Assignee: U.S. Philips Corporation, New York, N.Y.

[21] Appl. No.: 576,545

[22] Filed: Dec. 21, 1995

[30]     Foreign Application Priority Data

Dec. 23, 1994 [EP] European Pat. Off. ............. 94203745
Apr. 28, 1995 [EP] European Pat. Off. ............. 95201104

[51] Int. Cl.$^6$ .................................................. H04L 27/06
[52] U.S. Cl. .............................................. 375/341; 381/7
[58] Field of Search ..................... 375/340, 341, 375/262, 260, 316; 371/2.1, 39.1, 40.1; 381/7

[56]           References Cited

U.S. PATENT DOCUMENTS

| | | | |
|---|---|---|---|
| 4,333,160 | 6/1982 | Kobari et al. ................. | 395/497.04 |
| 4,547,887 | 10/1985 | Mui ................................ | 375/200 |
| 4,794,464 | 12/1988 | Sasson .......................... | 348/489 |
| 5,063,533 | 11/1991 | Erhart et al. .................. | 395/484 |
| 5,230,011 | 7/1993 | Gielis et al. ................... | 375/97 |
| 5,369,652 | 11/1994 | Bailey et al. .................. | 371/40.1 |
| 5,384,782 | 1/1995 | Elms .............................. | 370/529 |
| 5,406,551 | 4/1995 | Saito et al. .................... | 375/346 |
| 5,430,767 | 7/1995 | Min ................................ | 371/38.1 |
| 5,452,288 | 9/1995 | Rahuel et al. ................. | 375/260 |
| 5,483,529 | 1/1996 | Baggen et al. ................. | 370/70 |
| 5,535,220 | 7/1996 | Kanno et al. .................. | 370/515 |
| 5,566,183 | 10/1996 | Partyka ......................... | 371/2.1 |
| 5,588,022 | 12/1996 | Dapper et al. ................. | 370/260 |

FOREIGN PATENT DOCUMENTS

| | | |
|---|---|---|
| 932003460 | 2/1993 | European Pat. Off. . |
| 942011149 | 11/1994 | European Pat. Off. . |
| 942025180 | 11/1994 | European Pat. Off. . |
| 0660558A2 | 6/1995 | European Pat. Off. .......... H04L 1/00 |

OTHER PUBLICATIONS

Huisken et al., "Specification, Partitioning and Design of a DAB Channel Decoder", IEEE Workshop on VLSI Signal Processing, Oct. 1993.

van den Enden et al., "Discrete–time signal processing", ISBN 0–13–216763–8, 1989, Prentice Hall.

U.S. Application Serial No. 08/576,544; Filing Date: Dec. 21, 1995.

U.S. Application Serial No.: 08/422,380; Filing Date: Apr. 14, 1995.

U.S. Application Serial No.: 08/523,704; Filing Date: Sep. 5, 1995.

Primary Examiner—Tesfaldet Bocure
Attorney, Agent, or Firm—Michael E. Belk

[57]                 ABSTRACT

In a digital audio broadcast receiver a digital audio transmission signal is supplied to a demodulator which provides demodulation samples. The demodulation samples are de-interleaved in a first section of a de-interleaving memory. After having been de-interleaved, demodulation samples are transferred to a second section of the de-interleaving memory. This transfer is effectuated in bursts via a relatively small buffer which stores the bursts. The second section of the de-interleaving memory effectively constitutes a relatively large buffer. De-interleaved demodulations samples are regularly read from the second section and supplied as a regular stream to a Viterbi decoder by means of a relatively small first-in first-out register.

5 Claims, 6 Drawing Sheets

DE-INTERLEAVING AND BUFFERING IN ONE MEMORY

FIELD OF THE INVENTION

The invention relates to the field of audio broadcasting and it is most closely related to the field of processing the received digital audio broadcasting signals.

BACKGROUND OF THE INVENTION

The article "Specification, Partitioning and Design of a DAB Channel Decoder" by J. A. Huisken et al. pp. 21–29 in VLSI Signal Processing VI, IEEE Special Publications, describes such a receiver for Digital Audio Broadcast (DAB). In Digital Audio Broadcast (DAB) a data-stream is interleaved to provide protection against temporal fades in the transmission channel. The interleaved data-stream is transmitted according to an Orthogonal Frequency Division Multiplex (OFDM) modulation technique. According to this technique the interleaved data-stream is effectively split up into a plurality of relatively low bit-rate data-streams. Each of these low-bit rate data-streams modulates a different carrier in a plurality of carriers which constitute the DAB transmission signal.

FIG. 1 of the cited IEEE article shows a block diagram of a DAB receiver. The input section comprises a front-end and a quadrature demodulator. The front-end frequency shifts a received DAB transmission signal to a lower intermediate frequency from which the quadrature demodulator derives in-phase and quadrature modulation components. These modulation components are digitized to form a digital signal which comprises the plurality of modulated carriers of the DAB signal.

The demodulation processor derives demodulation samples, called metrics, from the digital signal supplied thereto. Demodulation is performed by means of a fast Fourier transformation (FFT). The 4PSK differentially modulated carriers of the DAB signal provide two phase differences per carrier. The metrics are the quantized phase differences.

The metrics are interleaved before they are supplied to a Viterbi decoder for error correction. Interleaving prevents undesired metric correlation at the input of the Viterbi decoder. The metrics are de-interleaved by delaying successive metrics differently according to a cyclic repeated delay pattern. To delay the metrics an interleaving memory is used, indicated as DRAM in FIG. 1 of the cited article.

The cited IEEE article does not give any details on how time deinterleaved metrics, which relate to one data-stream to be received, are supplied to the Viterbi decoder.

SUMMARY OF THE INVENTION

An object of the invention is to provide a receiver as defined in the opening paragraph in which the costs for the hardware between the demodulator and the decoder is relatively low.

In the invention, convolutional encoded data of different radio programs are multiplexed into one data stream, interleaved, modulated and transmitted. A receiver for receiving the interleaved multiplex of encoded data-streams, comprises: a demodulator for providing demodulation samples; a de-interleaving memory for de-interleaving the demodulated samples; and a decoder for providing a received data-stream in response to de-interleaved demodulation samples supplied thereto. The invention also includes the process of operating the receiver.

To that end, a receiver according to the invention is characterised in that it further comprises a buffer for transferring de-interleaved demodulation samples (metrics) from a first section of said de-interleaving memory to a second section of said de-interleaving memory and a further buffer for transferring de-interleaved demodulation samples (metrics) from said second section of said de-interleaving memory to the decoder as a regular stream.

To receive one of the data-streams at the transmitter end, it is sufficient to only supply those metrics to the Viterbi decoder which relate to that data-stream. The data-stream occur in relatively irregular bursts. The Viterbi decoder, however, requires a regular stream of metrics at its input. Therefore, the irregular bursts of metrics, which relate to the data-stream to be received, are transformed into such a regular stream.

The first section of the de-interleaving memory receives irregular bursts of metrics, which relate to one data-stream, from the demodulator. In response thereto, the first section provides irregular bursts of de-interleaved metrics. A burst of time-interleaved metrics is temporarily stored in the buffer and then transferred to the second section in the de-interleaving memory. The second section of the de-interleaving memory serves as a buffer for de-interleaved metrics provided by the first section. Small groups of de-interleaved metrics which are stored in the second section are read out on a regular bases. This to obtain regular and relatively small bursts of metrics. These can be transformed into a regular stream for the Viterbi decoder by means of a relatively small first-in first-out memory.

An advantage of the invention is relatively low memory cost. De-interleaving generally requires a relatively large memory. For reasons of economy, commercially available standard DRAM's may be used for de-interleaving. The storage capacity of such DRAM's is standardized, for example, 64 kbit, 256kbit, 1 Mbit, etc. Not all this storage capacity may be needed for de-interleaving but, say, 80%. The invention effectively uses the remaining storage capacity, say 20%, to transform irregular metric bursts into a regular stream of samples. The hardware between the demodulator and the decoder comprises, in addition to the de-interleaving memory, only two further memories (buffers) which can be relatively small.

The invention further provides a receiving method as defined in claim 4. Advantageous embodiments are defined in the dependent claims.

An advantage of the embodiment defined in claim 2 is that the buffer which is used for transfer between the two sections of the de-interleaving memory can also be used as demodulator output buffer.

An advantage of the embodiment defined in claim 3 is that it provides transfer in accordance with a de-interleaving principle described in the European patent application 94203745.8 incorporated by reference herein together with any corresponding application.

BRIEF DESCRIPTION OF THE DRAWINGS

These and other aspects of the invention will be apparent from and elucidated with reference to the embodiments described hereinafter hereinafter in conjunction with the drawings, in which: In the drawings.

DESCRIPTION OF THE PREFERRED EMBODIMENTS

Figure 1A:
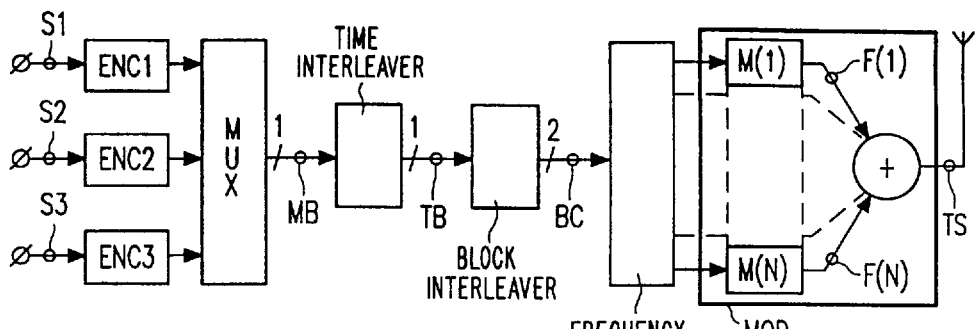
FIGS. 1a to 1e illustrate the generation of a DAB transmission signal.

The generation of a DAB transmission signal is schematically represented in FIGS. 1a to 1e. FIG. 1a shows a part of a DAB transmitter comprising the following functional blocks: three convolutional encoders ENC1, ENC2, ENC3, a multiplexer MUX, a time interleaver TIN, a block-interleaver BIN, a frequency-interleaver FIN and a modulator MOD which provides a DAB transmission signal TS.

Three source signals S1, S2 and S3 shown in FIG. 1a are, for example, MPEG layer 2 coded digital audio signals of three different radio programs. These source signals are supplied to the convolutional encoders ENC1, ENC2 and ENC3, respectively. Multiplexer MUX combines the three convolutional encoded source signals into a multiplexed bit-stream MB. The multiplexed bit-stream MB is supplied to the time interleaver TIN.

Figure 1B:
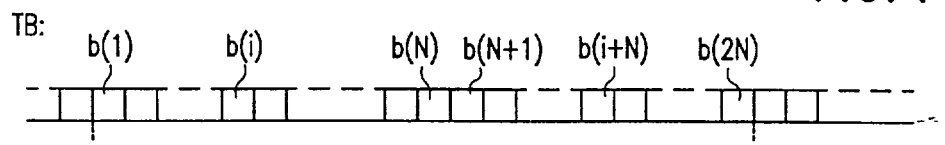

The time interleaver TIN changes the sequence of the bits in the multiplexed bit-stream MB by delaying successive bits differently according to a cyclic repeated delay pattern. This so-called time interleaving is described in the European patent application 94203745.8 incorporated by reference herein together with any corresponding application. FIG. 1 of this application illustrates the delay pattern used in DAB. By time interleaving the multiplexed bit-stream MB a time interleaved bit stream TB is obtained, which is shown in FIG. 1b. This time interleaved bit-stream TB is supplied to the block-interleaver BIN.

Figure 1C:
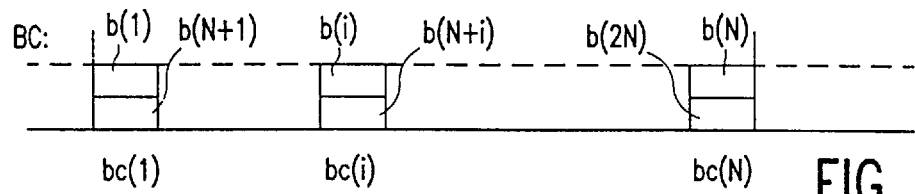

The block-interleaver BIN makes combinations of two bits in the time interleaved bit-stream TB in a manner which is illustrated by FIGS. 1b and 1c. FIG. 1b shows two groups of successive bits in the time interleaved bit-stream TB: a group comprising bits $b(1) \ldots b(N)$ and a group comprising bits $b(N+1) \ldots b(2N)$. Each bit in the group $b(1) \ldots b(N)$ is combined with the Nth successive bit which is in the group $b(N+1) \ldots b(2N)$. For example, bit $b(i)$ is combined with bit $b(i+N)$ resulting in a bit-combination $bc(i)$ shown in FIG. 1c. Likewise the boundary bits $b(1)$ and bit $b(N)$ are combined with bits $b(N+1)$ and $b(2N)$, respectively, to produce bit-combinations $bc(1)$ and $bc(N)$, respectively. In a similar manner the next two groups of N bits in the time interleaved bit-stream TB are combined, and so on. The thus obtained groups of bit-combinations $bc(1) \ldots bc(N)$ are supplied to the modulator MOD via the frequency interleaver FIN. First, the modulator MOD is discussed, then the frequency interleaver FIN.

Figure 1D:
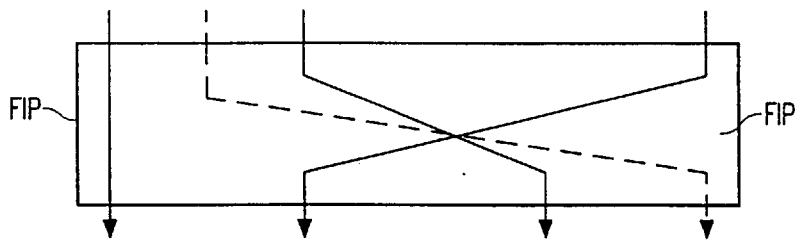
Figure 1E:
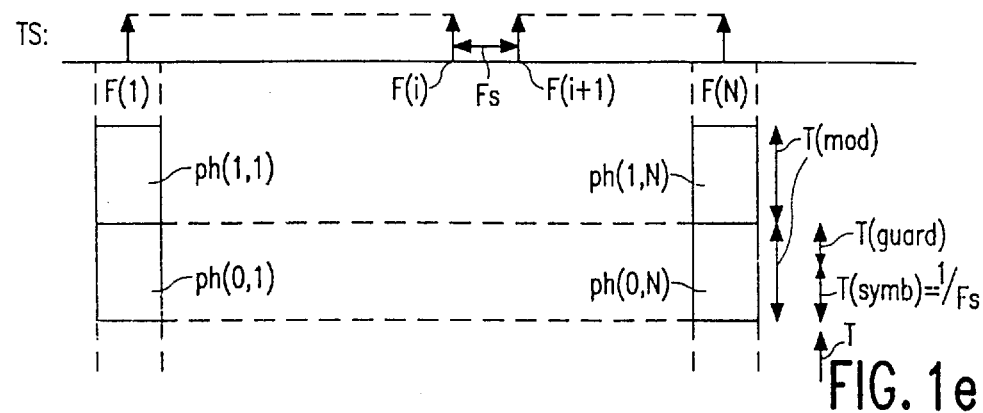

The modulator MOD is an orthogonal frequency division multiplex modulator which is functionally represented in FIG. 1a as an array of N modulators $M(1) \ldots M(N)$ which provide carriers of different frequencies $F(1) \ldots F(N)$, respectively. The sum of these carriers is the DAB transmission signal TS, which signal is illustrated in FIG. 1e. In the DAB transmission signal TS the spacing Fs between two frequency adjacent carriers is equidistant. For example, FIG. 1d shows the carrier frequency $F(i+1)$ of modulator $M(i+1)$ (not shown) which is Fs higher than the carrier frequency $F(i)$ of modulator $M(i)$. This holds for all integers "i" between 1 and N. In other words: the DAB transmission signal comprises a plurality of carriers on a fixed frequency grid.

The carriers in the DAB transmission signal are phase modulated in the following manner. The phase condition of the carriers change simultaneously at regular intervals T(mod). That is, after a simultaneous phase change, the phase conditions of the carriers are maintained for a period T(mod). This is illustrated in FIG. 1e in which two subsequent phase conditions of carries $F(1)$ and $F(N)$ are denoted as $ph(0,1)$, $ph(1,1)$ and $ph(0,N)$, $ph(1,N)$, respectively. The modulation duration T(mod) equals the inverse of the carrier spacing Fs plus a so-called guard interval T(guard). The inverse of the carrier spacing Fs is also referred to as symbol duration T(symb), such that T(mod)=T(symb)+T(guard).

The phase changes in the DAB transmission signal are determined by the earlier mentioned bit-combinations. In other words, the carriers are phase-differentially modulated by said bit-combinations. This is illustrated by the combination of FIGS. 1c and 1e. Each bit-combination in the group of bit-combinations $bc(1) \ldots bc(N)$ determines the phase change of a specific carrier in the DAB transmission signal TS.

The frequency interleaver FIN determines which bit-combination modulates which carrier. There is a fixed relation between the frequency of a carrier and position of a bit-combination in the group of bit-combinations $bc(1) \ldots bc(N)$ which modulates said carrier. This fixed relation is further referred to as frequency interleaving pattern. FIG. 1d illustrates the frequency interleaving pattern FIP of the frequency interleaver FIN shown in FIG. 1a.

In DAB the frequency interleaving pattern is such that successive bits in the time interleaved bit-stream TB do not modulate frequency adjacent carriers. In FIGS. 1c to 1e bit $b(1)$ combined with bit $b(N+1)$ modulates carrier $F(1)$. The combination of bits $b(2)$ and $b(N+2)$ (not denoted in FIGS. 1c and 1e) succeed bits $b(1)$ and $b(N+1)$, respectively. The latter combination modulates a carrier that is sufficiently frequency distant from carrier $F(1)$. Likewise, the successive bit-combinations are dispersed throughout the bandwidth of the DAB transmission signal. Due to this frequency-interleaving any frequency selective fading in the DAB transmission is effectively spread out across the full transmission bandwidth. In DAB three different modes of modulation are defined. The modulation parameters for these three different modes are listed in the table below:

| Parameter | Mode I | Mode II | Mode III |
|---|---|---|---|
| N (number of carriers) (number of samples) | 1536 | 384 | 192 |
| Fs (carrier spacing) | 1 kHz | 4 kHz | 8 kHz |
| T(symb) (symbol duration) | 1 ms | 250 µs | 125 µs |
| T(guard) (guard interval) | 248 µs | 62 µs | 31 µs |
| T(mod) (modulation duration) | 1,248 µs | 312 µs | 156 µs |

Finally, some notes relating to the multiplex of various programs in DAB. The multiplex is such that the time interleaved bit-stream TB comprises groups of 64 successive bits of one program only. Such a group of 64 bits is called a capacity unit. Further, the group of 2N bits as shown in FIG. 1b comprises an integer number of such capacity units. For example, in mode I there are 48 capacity units in the group of 2N=3072 bits.

Figure 2:
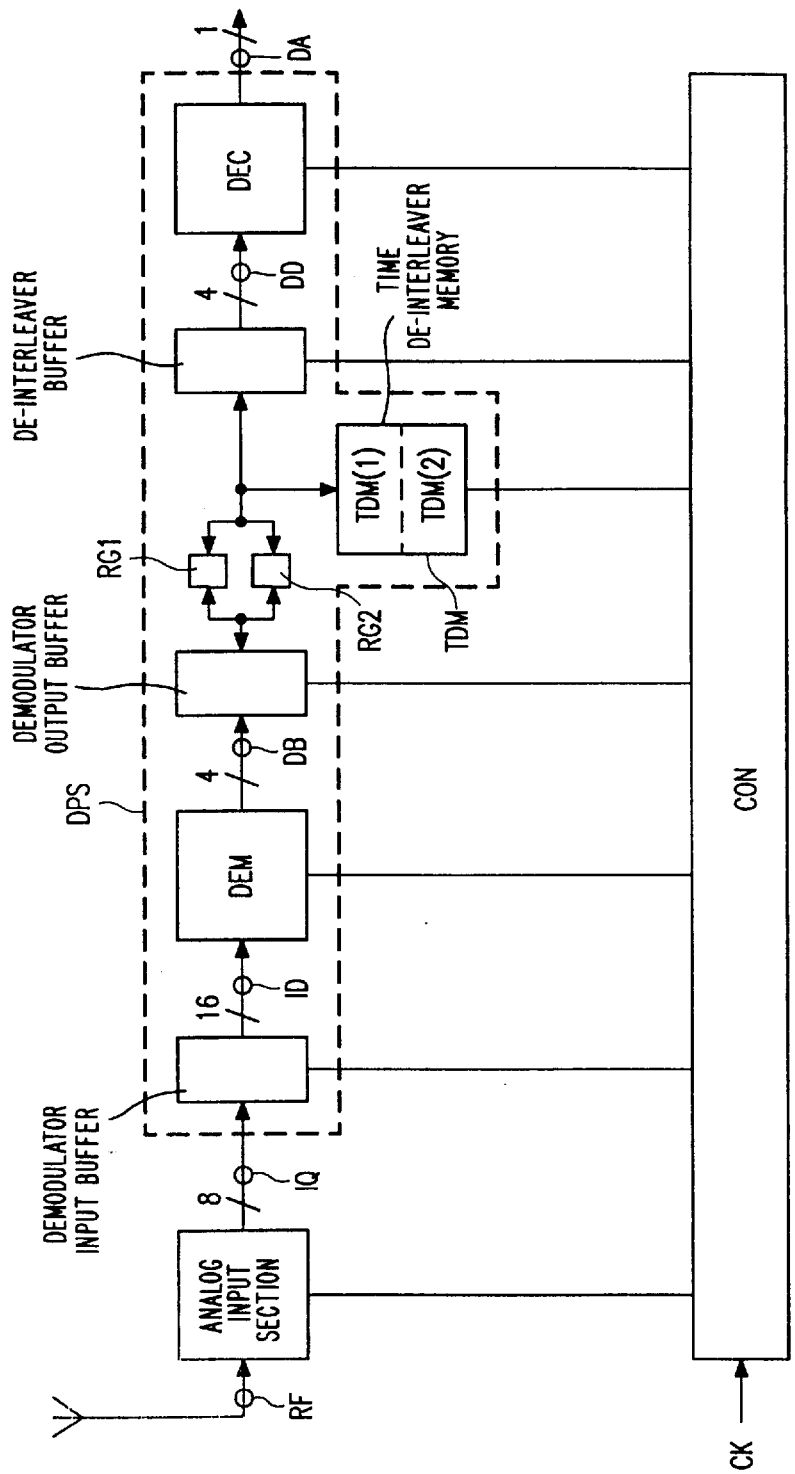
FIG. 2 is a block diagram of an embodiment of a receiver according to the invention for receiving the DAB transmission signal.

FIG. 2 is a block diagram of an embodiment of a receiver according to the invention for receiving a DAB transmission signal which is generated as described above. Roughly, this receiver comprises a mixed analog/digital input section INS, a digital signal processing section DPS and a controller CON for controlling these sections. Furthermore, these sections operate under the control of a clock signal CK.

The input section INS converts a received DAB transmission signal RF into a digital signal IQ which is a digital representation of the plurality of phase-modulated carriers in the DAB transmission signal. The digital signal processing section DPS derives a received bit-stream DA from the digital signal IQ. Ideally, this received bit-stream DA is identical to one of the source signals S1, S2 or S3 at the transmitter end shown in FIG. 1a, depending on which radio program the user has chosen.

More specifically, the input section INS functionally effectuates a complex frequency shift. This complex frequency shift is such that the center frequency of the received DAB transmission signal RF is shifted to zero frequency. The digital signal IQ at the output of the input section INS is the digital representation of the DAB transmission signal RF which has been shifted to zero frequency. The digital signal IQ is a complex signal, that is, it comprises real and imaginary samples. This due to the fact that the spectrum DAB transmission signal is not symmetrical.

Figure 3:
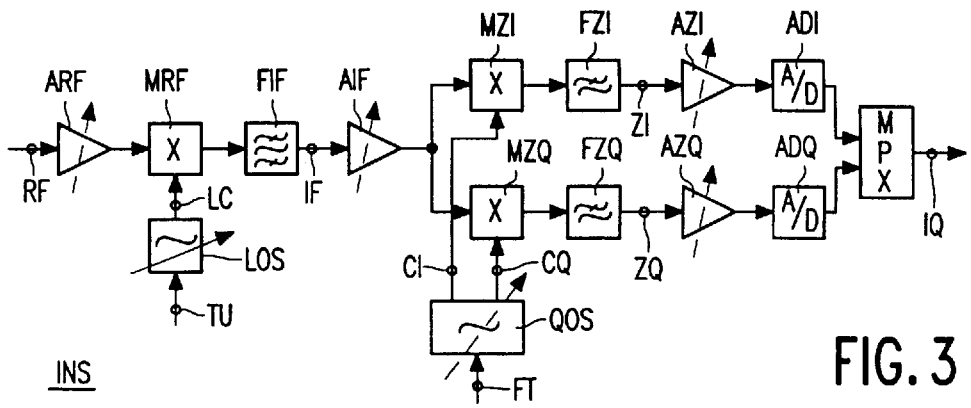
FIG. 3 shows an example of the input section in the embodiment of FIG. 2.

In an embodiment of the receiver shown in FIG. 2 an input section INS as shown in FIG. 3 is used. Basically, the input section shown in FIG. 3 effectuates two frequency conversions which effectively shift the received DAB transmission signal RF to zero frequency. Subsequent to these frequency conversions, the frequency shifted DAB transmission signal is digitized.

A mixer MRF, which receives a local mixing carrier LC from a local oscillator LOS, effectuates the first frequency conversion. It shifts the received DAB transmission signal RF to fit in the pass band of a channel selection filter FIF which suppresses unwanted signals. The channel selection filters provides an intermediate frequency DAB signal IF of about 40 MHz, for example.

Mixers MZI and MZQ, which receive in-phase and quadrature mixing carrier CI and CQ, respectively, from an quadrature oscillator QOS, effectuate the second frequency conversion. This second frequency conversion effectively shifts the intermediate frequency DAB signal IF to zero frequency. The in-phase and quadrature mixing products from the mixers MZI and MXQ are low pass filtered by filters FZI and FZQ, respectively, to provide an in-phase component ZI and a quadrature component ZQ, respectively. In-phase component ZI and quadrature component ZQ are the real and imaginary components of a complex signal which is the received DAB transmission signal shifted to zero frequency.

The in-phase and quadrature components ZI and ZQ are digitized by means of A/D converters ADI and ADQ, respectively, and combined in the multiplexer MPX to produce the digital signal IQ. The sample rate SR of the A/D converters ADI and ADQ is determined by the controller CON shown in FIG. 2 and related to the clock signal CK. In an embodiment the sample rate SR is 2,048 MHz and the samples of the A/D converters ADI and ADQ are time multiplexed in the multiplexer MPX. Further, the A/D converters both have 8-bit accuracy.

Figure 4:
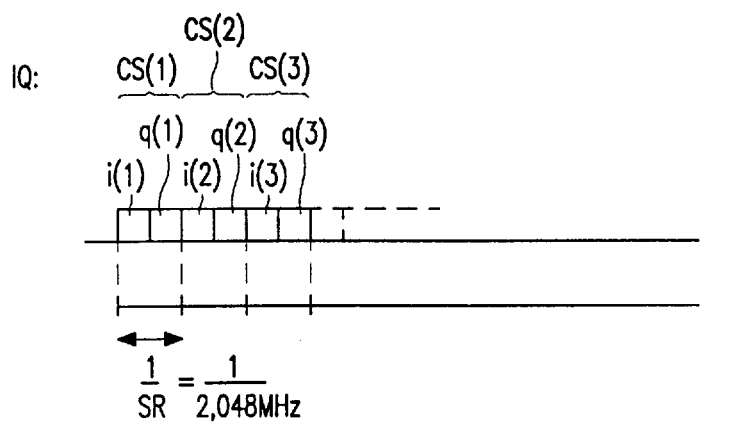
FIG. 4 illustrates the output signal which the exemplary input section provides.

FIG. 4 depicts the signal IQ provided by the above-identified embodiment of the input section INS. The signal IQ comprises real samples i(.) and imaginary samples q(.). The real and imaginary samples are 8-bit representations of in-phase and quadrature components at the input of the A/D converters AZI and AZQ, respectively, shown in FIG. 3. The real and imaginary samples are time multiplexed: 8-bit real and imaginary samples i(.) and q(.), respectively, alternately occur. The combination of a real sample i(.) and a successive imaginary sample q(.) constitutes a complex sample cs(.). For example, samples i(1) and q(1) form complex sample cs(1). The next two real and imaginary samples i(2) and q(2) form complex sample cs(2), and so on.

It is further noted that the input section shown in FIG. 3 comprises amplifiers ARF, AIF, AZI, and AZQ in order to drive the A/D converters and other parts with signals of adequate amplitude. To accommodate for varying reception signal levels one or more of these amplifiers are preferably gain controlled. Other features of the input section include frequency control of the local oscillator LOS and the quadrature oscillator QOS. The frequency of the local carrier LC is preferably such that the desired DAB transmission signal symmetrically fits in the pass band of the channel selection filter FIF. The frequency of the in-phase and quadrature carriers CI and CQ is preferably the center frequency of the intermediate DAB signal. Control signals TU and FT control the frequency of the local oscillator LOS and the quadrature oscillator QOS, respectively. The control signal FT is, for example, a frequency error signal obtained from the digital processing section DPS. The control signal TU is, for example, a combination of such a frequency error signal and an output signal from a user interface. Via the user interface the DAB transmission signal is selected which contains the desired program, for example, source S1.

The operation of the digital processing section DPS shown in FIG. 2 will now be explained with reference to FIGS. 5a to 5e, 6 and 7. Further, the explanation which follows relates to the reception of a DAB transmission signal according to mode I.

Figure 5A:
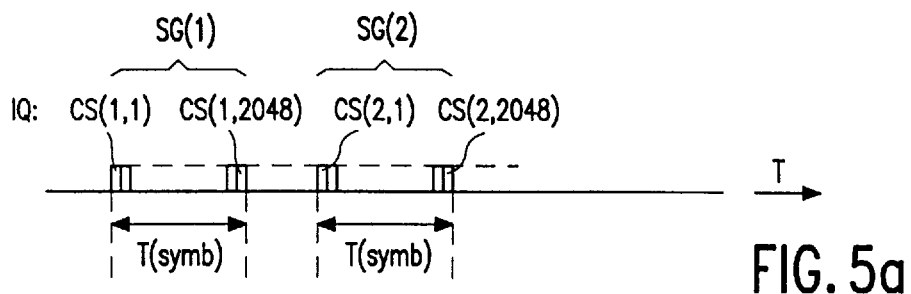
FIGS. 5a to 5e illustrate data transfer and data storage related to demodulation in the embodiment of FIG. 2.

FIG. 5a shows the digital signal IQ at the input of the digital processing section DPS in a more global form than in FIG. 4. Due to the sample rate SR of the A/D converters ADI and ADQ in the input section shown in FIG. 3, there are 2048 successive complex samples in the symbol duration T(symb) for mode I, which is 1 ms. FIG. 5a shows a group SG(1) of 2048 successive samples cs(1,1) . . . cs(1,2048) in the digital signal IQ which covers a symbol duration T(symb). The same applies to another group SG(2) of successive samples cs(2.1) . . . cs(2,2048).

Figure 5B:
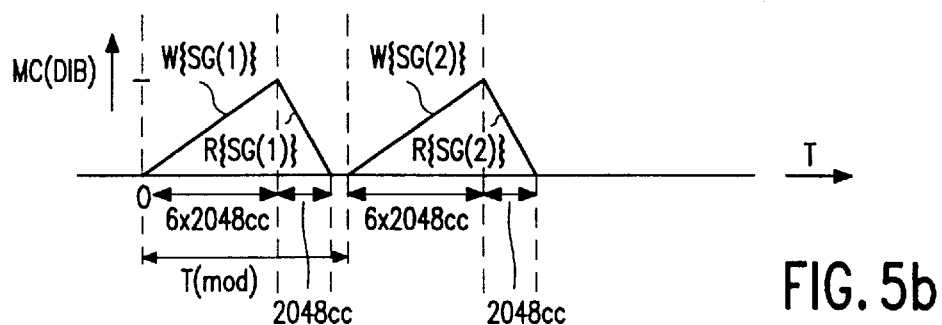

Within each modulation duration T(mod) a group of 2048 complex samples in the digital signal IQ are stored in a demodulator input buffer DIB. This is illustrated in FIG. 5b in which the number of bits MC(DIB) stored in demodulator input buffer DIB is set out on the vertical axis. At T=0 the demodulator input buffer DIB is empty, that is, it does not contain relevant data. Starting from T=0 the first complex sample cs(1,1) of the group of 2048 successive samples SG(1) is written into the demodulator input buffer DIB, then the next sample cs(1,2), and so on. The writing of samples of the group SG(1), indicated by W{SG(1)} in FIG. 5b, continues up till the 2048th sample cs(1,2048) of group SG(1). When the writing of complex sample group SG(1) is completed there are 8×2×2048 bits stored in the demodulation input buffer DIB. After a period equal to the modulation duration T(mod) from T=0, the demodulation input buffer DIB is empty again, that is, MC(DIB)=0 and the writing of a new group SG(2) of 2048 complex samples starts.

By setting the start of the above described writing of 2048 complex samples into the demodulator input buffer DIB appropriately, portions of the digital signal IQ are taken that are not affected by inter-symbol interference (ISI). Such interference may result from multipath reception of the DAB transmission signal, for example, resulting in leading and/or trailing echoes. The previously mentioned guard interval has been introduced in DAB to accommodate for such echoes. Further information can be found in EP-A-0,613,266 (U.S. Pat. No. 5,524,027 issued Jun. 4, 1996).

The start is of the writing of a group of 2048 samples SG(.) into the demodulator input buffer DIB is determined by the controller CON. This, on the basis of signals derived further in the digital processing section DPS, for example, with the aid of periodic special symbols in the DAB transmission signal. To understand the invention a more detailed description of the writing start control is not necessary.

FIG. 5b further illustrates that subsequent to the writing of a complex sample group SG(.) into the demodulator input buffer DIB, this group of samples is read. In FIG. 5b the reading of the group SG(1) and that of SG(2) is denoted by R{SG(1)} and R{SG(2)}, respectively. Each cycle of the clock signal CK, briefly clock cycle (cc), a 16-bit complex sample stored in the demodulation input buffer DIB is read. That is, the 8-bit real part and the 8-bit imaginary part of the complex samples are read simultaneously. Hence, it takes a period of 2048 clock cycles to read all the complex samples of a group stored in the demodulator input buffer DIB.

In an embodiment the frequency of the clock signal, briefly clock frequency Fc, was 6 times the sample rate SR of the A/D converters in the input section INS. That is, Fc=12,28 MHz and cc=81,43 ns. In that case, the reading R{SG(.)} of a sample group SG(.) stored in the demodulator input buffer DIB takes 167 $\mu$s. This read period of 167 $\mu$s is significantly smaller than the guard interval of 248 $\mu$s in mode I. Hence, the sum of this read period and the write period, which is the symbol duration T(symb), is significantly smaller than the modulation duration T(mod). As a consequence, the demodulator input buffer DIB is empty at the time when a group SG(.) of 2048 complex samples needs to be written into the demodulation input buffer DIB.

Figure 5C:
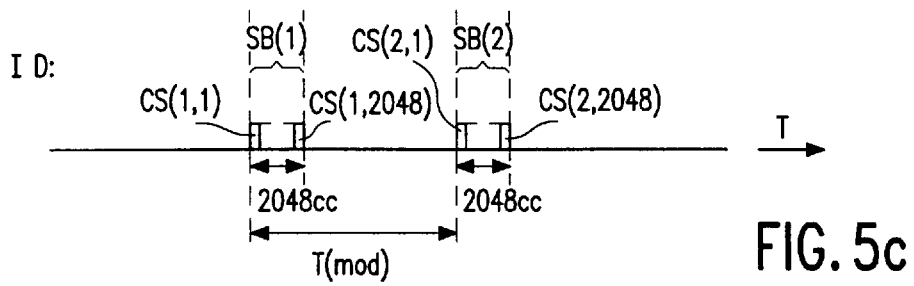

FIG. 5c illustrates a demodulator input signal ID which results from reading the complex samples in the demodulator input buffer DIB. The demodulator input signal ID comprises bursts of 2048 complex samples. In FIG. 5c two bursts are shown: one sample burst SB(1) comprising complex samples cs(1,1) . . . cs(1,2048) and one sample burst SB(2) comprising complex samples cs(2,1) . . . cs(2,2048). Within the bursts a new complex sample occurs each clock cycle. The average burst rate is equivalent to the modulation duration. Further, in the demodulator input signal ID the real part i(.) and imaginary part q(.) of a complex sample cs(.) are line-multiplexed, that is, these parts occur simultaneously.

The nature of the demodulator input signal ID shown in FIG. 5c should be recalled at this point. In fact, the demodulator input signal ID is the received DAB transmission signal RF which has been reconfigurated into a different format. This, by successively frequency shifting the received DAB transmission signal RF to zero, digitizing the result thereof and by periodical time compression of the frequency shifted and digitized received DAB transmission signal. Hence, like the received DAB transmission signal RF, the demodulator input signal ID comprises a plurality of phase modulated carriers.

The demodulator DEM shown in FIG. 2 effectuates a differential phase demodulation for each carrier in the demodulator input signal ID and quantizes the result thereof into so-called 4-bit metrics. For each carrier the detected differential phase between two successive complex sample bursts is expressed in a pair of metrics. Each metric comprises a gross bit, which is understood as defined in the European patent application 94201114.9 (U.S. Pat. No. 5,524,027 issued Jun. 4, 1996) incorporated herein by reference together with any corresponding applications. The two gross bits of a metric pair are the estimate of a certain bit-combination at the transmitter end as shown in FIG. 1c. Apart from the gross bit, each metric comprises three so-called reliability bits which indicate the likelihood that the estimated gross bit value is correct.

More specifically, the demodulator DEM comprises a fast Fourier transform processor. This processor calculates the fast Fourier transform of each complex sample burst in the demodulator input signal ID. The demodulator DEM performs a soiled radix-4 fast Fourier transform in several steps in which so-called FFT butterflies are effectuated. A sample burst SB(.) provided by the demodulation input buffer DIB directly undergoes the first FFT step. The results of this first step and further steps are stored in an internal memory (not shown) in the demodulator DEM. Fast Fourier transform calculation is described in 'Discrete-time signal processing' by A.W.M. van den Enden and N.A.M. Verhoeckx, Prentice Hall, 1989.

Figure 6:
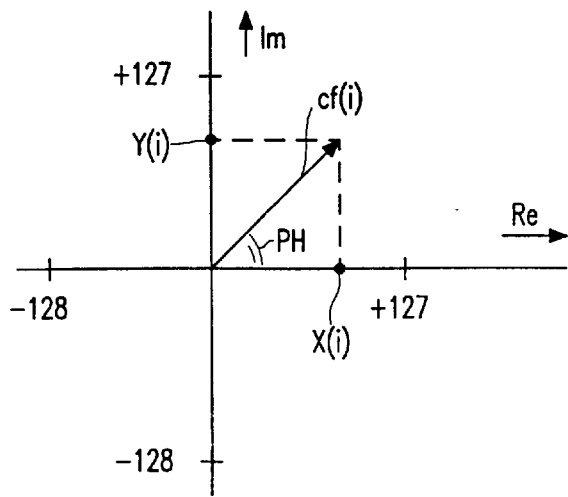
FIG. 6 shows a complex sample in the embodiment shown in FIG. 2 and the phase information it contains.

Each of the 2048 complex samples which result from a fast Fourier transform of a complex sample burst, is a Cartesian representation of the phase condition of a specific carrier in that burst. This is illustrated in FIG. 6 in which the two's complement value x(i) of the 8-bit real part of a complex Fourier transform sample cf(i) is plotted on the x-axis. The value y(i) of the 8-bit imaginary part of this sample is plotted on the y-axis. The phase condition which the complex Fourier transform sample cf(i) expresses is denoted as PH. The result of each fast Fourier transform is written into an internal memory of the is demodulator DEM to be used, after one modulation duration T(mod), for differential phase calculation.

To effectuate differential phase demodulation each of the 2048 complex samples which result from a fast Fourier transform is multiplied with the complex conjugate of a corresponding complex sample in the fast Fourier transform of a previous burst. The result of such a complex conjugate multiplication is a complex sample which represents the phase difference of a specific carrier between two successive symbol durations in a manner as shown in FIG. 6. The complex conjugate multiplications are performed in time multiplex with the last step of the fast Fourier transform. This time multiplexed last step takes 4096 clock cycles during which 2048 complex samples are provided which are the result of the sample-by-sample complex conjugate multiplication of the fast Fourier transforms of two successive complex sample bursts in the demodulator input signal ID.

The demodulator DEM further comprises a metric quantizer which quantizes each complex sample which results from the above identified complex conjugate multiplications into a pair of so-called 4-bit metrics. More specifically, the 8-bit real part of such a sample is quantized into a metric and the 8-bit imaginary part into an other metric, both metrics constituting a pair. The European patent application 94201114.9 describes metric quantization.

Figure 5D:
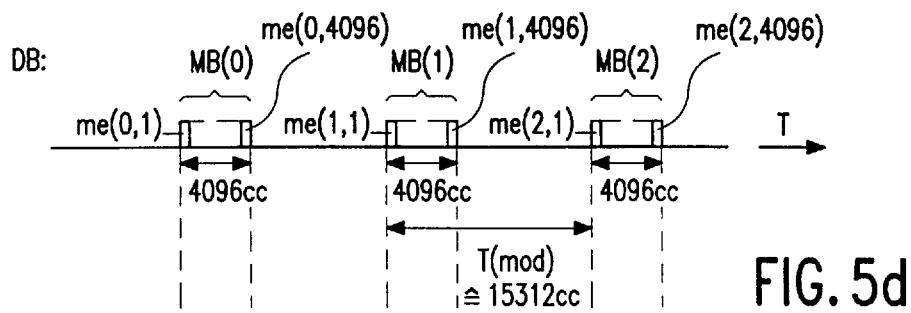

FIG. 5d illustrates the demodulator output signal DB which comprises bursts of 4096 metrics in which during each clock cycle (cc) a new metric occurs. In FIG. 5d three bursts MB(0), MB(1) and MB(2) are shown, comprising metrics me(0,1) ... me(0,4096), metrics me(1,1) ... me(1,4096) and metrics me(2,1) ... me(2,4096), respectively. The burst MB(1) is the result of the differential phase demodulation and quantization on the burst of complex samples SB(1) shown in FIG. 5c and a preceding burst of complex samples SB(0) which is not shown. When the demodulator DEM has outputted the metric burst MB(1) it is ready to receive a new burst of complex samples SB(2) from the demodulator input buffer DIB. Within one modulation duration T(mod) the demodulator will effectuate differential phase demodulation and quantization which will result in a new burst of metrics MB(2).

A selection of 3072 metrics of each burst MB(.) of metrics in output signal DB is written into a demodulator output buffer DOB shown in FIG. 2. The selection is due to the following. As earlier noted, in DAB mode I there are 1536 modulated carriers. However, the demodulator output signal DB comprises information derived from 2048 carriers. Hence, each metric burst MB(.) comprises 512 non-relevant metric pairs related to carriers outside the frequency band occupied by the DAB transmission signal TS of which the spectrum is illustrated in FIG. 1e. The selection of 1536 relevant metric pairs which are stored in the demodulator output buffer DOB is discussed below.

Figure 5E:
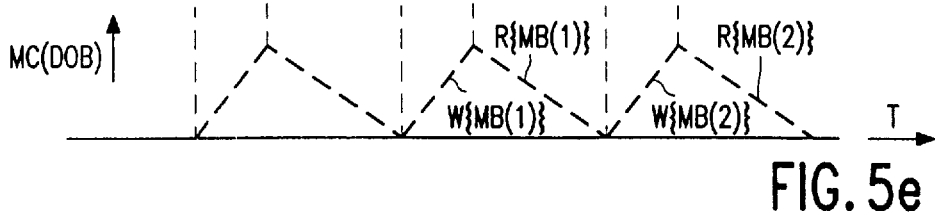

FIG. 5e illustrates write and read operations in the demodulator output buffer DOB. The number of bits stored in this memory MC(DOB) is set out on the vertical axis like in FIG. 5b. The writing of the selected 3072 metrics of the burst MB(1) is denoted as W{MB(1)}. In the time span between this burst and the next burst of metrics MB(2) the selected 3072 metrics of the metric burst MB(1) are read from the demodulator output buffer DOB which is denoted as R{MB(1)}. At the start of the next burst of metrics MB(2) the demodulation output buffer DOB contains no relevant data. The writing and subsequent reading of this burst is denoted as W{MB(2)} and R{MB(2)}, respectively.

In FIG. 5e the number of bits stored in the demodulator output buffer DOB is plotted against time (T) with dashed lines. This to illustrate that, in contrast to the demodulator input buffer DIB, the number of bits stored in the demodulator output buffer DOB increases or decreases somewhat irregularly in time. The write irregularity is a consequence of the above mentioned selection of 3072 metrics out of 4096 metrics in a burst. The read irregularity is due to the fact that the reading R{MB(.)} of 3072 selected metrics of a bursts MB(.) is done in time multiplex with other read and write operations in between successive metric bursts. These other read and write operations will be discussed further in the description.

The demodulator output buffer DOB effectively re-arranges the order of the relevant metrics in a burst. This, by reading metrics in an order which is different from the order in which they were written. The metrics are read in an order which, if all metrics would be read during each modulation duration T(mod), is such that a metric stream would be obtained of which the gross bits constitute an estimate of the time interleaved bit-stream TB at the transmitter end shown in FIG. 1b. Under ideal reception conditions the estimate would be correct. In that case, the stream of gross bits provided by the demodulator output buffer DOB would be identical to the time interleaved bit-stream TB.

The order of the relevant metrics provided by the demodulator DEM is re-arranged for several reasons. The first reason is the block interleaving and frequency interleaving at the transmitter end as earlier noted and illustrated in FIGS. 1a to 1e. The second reason is that the demodulator DEM provides metric pairs in a so-called bit-reversed carrier order. That is, the carrier number to which a metric pair relates is the bit-reversal of the number this metric pair in a metric burst. For example, the 1024th metric pair in a burst, which is metric pair number 100000000000 in binary notation, relates to carrier number 000000000001 in binary notation, that is, carrier number 1. The 1025th metric pair, number 100000000001 in binary notation relates to carrier number 100000000001 in binary notation, bit-reversal has no effect in this example, that is it relates to carrier number 1025. It should be noted that carrier number N means the Nth carrier successive in frequency at the input of the demodulator DEM.

In the receiver shown in FIG. 2, block de-interleaving, frequency de-interleaving and bit-reversal is effectively performed during the writing of metrics in the demodulation output buffer DOB. That is, the metrics are stored in an order which is such that gross bits in successive memory locations provide the estimate of a group of 2N=3072 bits in the bit-stream TB at the transmitter end as shown in FIG. 1b. For example, when the writing W{me(1,.)} illustrated in FIG. 5e is just completed, a first memory location comprises the metric of which the gross bit is the estimate of the bit b(1) shown in FIG. 1b. A second memory location, of which the address is one unit higher than the first memory location comprises the metric of which the gross bit is the estimate of the successive bit b(2) in the group of 2N bits shown in FIG. 1b, and so on. Consequently, if the demodulator output buffer DOB is read out linearly, that is read addresses change by unit, a metric stream would be obtained which corresponds to the time interleaved bit-stream TB at the transmitter end.

Not all metrics in the demodulator output signal DB which are written into the demodulator output buffer DOB, are read and further processed. As noted earlier, the DAB transmission signal is a multiplex of various programs, illustrated in FIG. 1a by the three sources S1, S2 and S3. To receive one program, source S1 for example, it is sufficient to only further process the metrics related to that one program.

Due to the combined frequency de-interleaving, block de-interleaving and bit-reversal while writing metrics into the demodulator output buffer DOB, program selection is relatively easy. This is because the metrics are stored capacity unit-wise in the demodulator output buffer DOB. For example, memory location 0 to 63 comprise a first capacity unit, memory location 64 to 127 a second, and so on. The information which about capacity unit relates to which program, is included in the DAB transmission signal and used by the controller CON to select the desired program.

The metrics of the selected program which are read from the demodulator output buffer DOB, are subsequently stored in a time de-interleaving memory TDM shown in FIG. 2. This to effectuate a sequence alteration which is complementary to the time de-interleaving at the transmitter end. The European patent application 94203745.8 describes the method of time de-interleaving applied in the receiver shown in FIG. 2.

Figure 7:
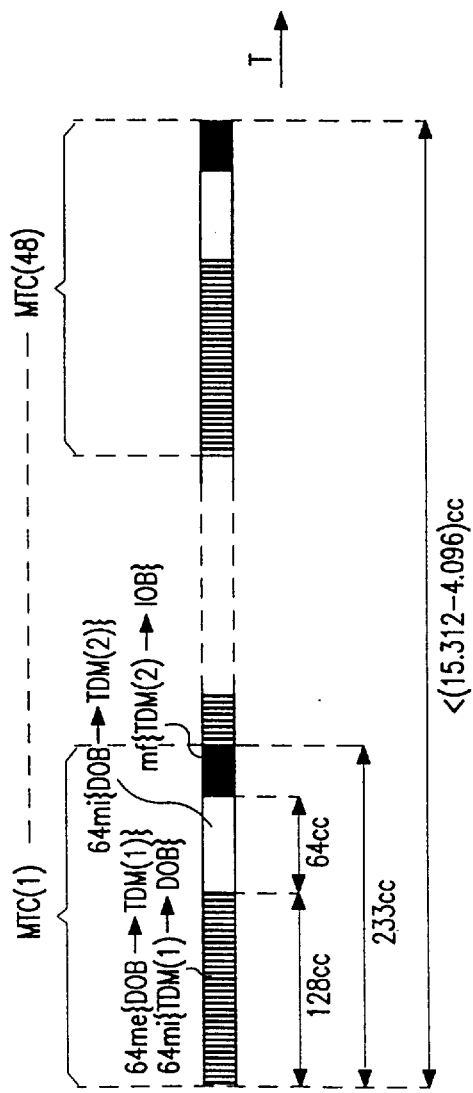
FIG. 7 illustrates data transfer related to interleaving and buffering in the embodiment of FIG. 2.

Apart from effectuating time de-interleaving, the time de-interleaving memory TDM is also used to for buffering time de-interleaved metrics. The time de-interleaving memory TDM can be divided into two sections: a first section TDM(1) in which metrics are stored that need to be time de-interleaved and a second section TDM(2) in which time de-interleaved metrics are stored that have been time de-interleaved. FIG. 7 of the patent application European patent application 94203745.8 illustrates a time de-interleaving memory which has two such sections.

To move metrics from the first section to the second section of the interleaving memory the demodulator output buffer DOB is used. The demodulator output buffer DOB temporarily stores de-interleaved metrics which are read from the first section TDM(1) and which need to be written into the second section TDM(2) for buffering.

The buffered time de-interleaved metrics which are stored in the second section of the time de-interleaving memory TDM(2), are supplied to a Viterbi decoder DEC via a de-interleaver output buffer IOB, both shown in FIG. 2. The Viterbi decoder input signal DD comprises a regular stream of metrics which, for example, relate to one program, say the source S1 shown in FIG. 1a. In the case that the encoder ENC1 shown in FIG. 1a provides a bit-stream of 384 kbits p/s, the de-interleaver output buffer IOB provides one new metric every 32 clock cycles to the Viterbi decoder DEC.

FIG. 7 illustrates the transfer of metrics between the demodulator output buffer DOB, the time de-interleaving memory TDM and the de-interleaver output buffer IOB. In FIG. 7 a period of 11184 clock cycles is shown which falls between two successive bursts in the demodulator output signal DB, for example, between metric bursts MB(1) and metric burst MB(2) shown in FIG. 5d. There are 48 metric transfer cycles MTC(1) ... MTC(48) in the period of 11184 clock cycles, each metric transfer cycle covering a period of 233 clock cycles.

The metric transfer cycles MTC(1) ... MTC(48) are sub-divided into three parts: a first part of 128 clock cycles shown with dashed filing, a second part of 64 clock cycles shown with no filling and a third part of 41 clock cycles shown with dark filing.

In the first part 64 metrics are transferred from the demodulator output buffer DOB to the first section of time de-interleaving memory TDM(1), which is indicated in FIG. 7 as 64me{DOB→TDM(1)}. These 64 metrics originate from the most recent metric burst in the demodulator output signal DB and relate to one capacity unit in the time interleaved bit-stream TB in the transmitter of FIG. 1a. Further, in the first part of the metric transfer cycle 64 metrics are transferred in just the opposite direction, that is, from the first section of the time de-interleaving memory TDM(1) to the demodulator output buffer DOB, which is indicated in FIG. 7 as 64mi{TDM(1)→DOB}. These 64 metrics have been time de-interleaved and relate to one capacity unit in the multiplexed bit-stream MB in the transmitter of FIG. 1a.

More specifically, the transfer of metrics in the first part of the metric transfer cycles MTC(1) ... MTC(48) proceeds as follows. At an, say uneven, clock cycle in the first part, a metric to be time de-interleaved is read from the demodulator output buffer DOB and written into a register RG1. Simultaneously, a time de-interleaved metric is read from the time de-interleaving memory TDM and written into a register RG2. At the next, say even, clock cycle, the metric in the register RG1 is written into the first section of the time de-interleaving memory TDM(1). Simultaneously, the time de-interleaved metric in the register RG2 is written into the demodulator output buffer DOB. The above described transfer from the demodulator output buffer DOB to the time de-interleaving memory TDM and vice versa is repeated for 64 even and 64 uneven clock cycles, thus in total 128 clock cycles.

During the first part of the metric transfer cycles MTC(1) ... MTC(48), the address for the demodulator output buffer DOB needs to be changed each two clock cycles only. That is, during the first part there is a total of 64 different addresses in the demodulator output buffer which are accessed. When a metric to be time de-interleaved is read from an address, during an uneven clock cycle, this address becomes vacant. Consequently, this same address may be used to write therein a time de-interleaved metric during the next, even clock cycle.

In the second part of the metric transfer cycles MTC(1) ... MTC(48), the 64 time de-interleaved metrics which were written into the demodulator output buffer DOB during the first part are transferred to the second section of the time de-interleaving memory TDM(2). This transfer is indicated in FIG. 7 as 64mi{DOB→TDM(2)}. Hence, at the end of the second part in a metric transfer cycle 64 time de-interleaved metrics, relating to one capacity unit, have effectively moved from the first section of the time de-interleaving memory TDM(1) to the second section TDM(2) for buffering.

It should be noted that not in all metric transfer cycles MTC(.) metrics are transferred from the demodulator output buffer DOB to the time de-interleaving memory TDM, and vice versa. There may be consecutive metric transfer cycles in which during the first and second part no metrics are transferred. This, due to the program selection in the embodiment of the receiver shown in FIG. 2. Only those metrics that relate to a capacity unit of the desired program are read from the demodulation output buffer DOB and written into the time de-interleaving memory TDM. Hence, the average metric-rate in the transfer from the demodulation output buffer DOB to the time de-interleaving memory TDM, and vice versa, is lower than the metric-rate in the demodulator output signal DB shown in FIG. 5d.

In the third part of the metric transfer cycles MTC(1) ... MTC(48), buffered time de-interleaved metrics are read from the second section of the time de-interleaving memory TDM(2) and supplied to the de-interleaver output buffer IOB. This transfer is indicated in FIG. 7 as mb{TDM(2)→IOB}. It will be clear that the average rate of metrics in the second and third part of the metric transfer cycles are equal. However, in contrast to the second part of the metric transfer cycles, metrics are transferred on a more regular bases during the third part. As a consequence, the de-interleaver output buffer IOB receives regular bursts of metrics which occur during the third part of the metric transfer cycles MTC(.).

The de-interleaver output buffer IOB is a relatively small first-in first-out register. It transforms the bursts of metrics it receives from the time de-interleaving memory TDM into a regular stream of metrics DD indicated in FIG. 2. This regular stream of metrics DD enters the Viterbi decoder DEC. For example, the embodiment shown in FIG. 2 selects the radio program which relates to the source S1 shown in FIG. 1a and the encoder ENC1 provides a bit-stream of 384 kbits p/s. In that case, the de-interleaver output buffer IOB provides one new metric every 32 clock cycles to the Viterbi decoder DEC.

In response to the regular stream of metrics DD the Viterbi-decoder provides a received bit-stream DA. This received bit-stream DA corresponds, for example, to source SI shown in FIG. 1a if this radio program is selected.

Now some implementation details relating to the control of the demodulator output buffer DOB are discussed.

Figure 8:
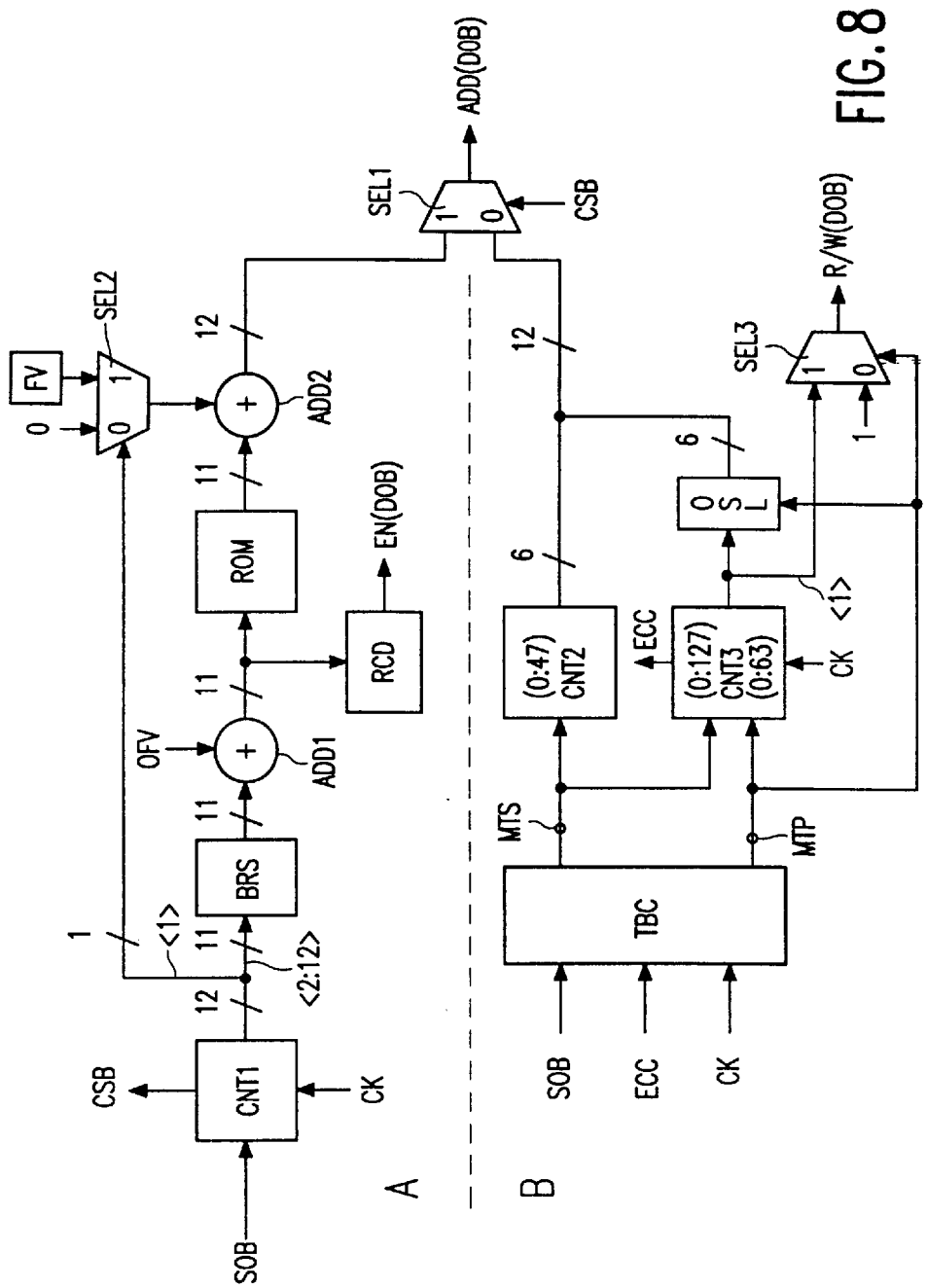
FIG. 8 shows an example of control circuitry for the demodulator output buffer in the embodiment of FIG. 2.

FIG. 8 is a block diagram of some control circuitry for the demodulator output buffer DOB. The block diagram can roughly be divided into two parts. The upper part, denoted as A, is mainly related to the generation of addresses during a metric burst MB(.) in the demodulator output signal DB. The lower part, denoted as B, is mainly related to the generation of addresses in between two successive bursts, that is, during the metric transfer cycles described above.

A selector SEL1 determines which of the two parts of the block diagram provides address information ADD(DOB) for the demodulation output buffer DOB. The selector SEL1 is controlled by a control signal CSB which selects the 1-input of selector SEL1 during metric burst MB(. ) and which selects the 0-input in between metric bursts. The control signal CSB may also be used to control a further selector (not shown) at the data input of the demodulator output buffer DOB. This, to either select data from the demodulator DEM or data from the registers RG1 and/or RG2 shown in FIG. 2. The control signal CSB may, for example, be derived from the upper part A as further explained.

In the upper part A of the block diagram a counter CNT1 receives a start of burst signal SOB indicating the start of a metric burst. This start of burst signal SOB is obtained from a part of the controller CON which controls the demodulator DEM. In response to the start of burst signal SOB, the counter CNT1 begins a 12-bit count sequence, that is, it counts from 0 to 4095. Each clock cycle the counter is incremented one unit until the 12-bit count sequence is completed. Hence, the count sequences provided by the counter CNT1 are synchronous with the metric bursts. The counter provides the earlier mentioned control signal CSB of which the value depends on whether counter CNT1 is counting or not. Apart from the least significant bit <1>, the other 11 bits <2:12> of the 12-bit count sequence are supplied to a bit-reversal section BRS.

The bit-reversal section BRS effectuates a bit-reversal of the 11 bits <2:12> of the 12-bit count sequences to produce carrier number sequences. The 11-bit numbers in a carrier number sequence change each two clock cycles and indicate to which carriers the successive pairs of metrics in a metric burst relate. As noted earlier, the demodulator DEM shown in FIG. 2 provides the pairs of metrics in a so-called bit-reversed carrier order. The carrier number sequence provided by the bit-reversal section BRS is supplied to an adder ADD1.

Adder ADD1 offsets the 11-bit numbers in the carrier number sequence with an offset value OFV. This offset value OFV determines which 3072 of the 4096 metrics in the bursts are stored in the demodulator output buffer DOB for further processing. The 3072 metrics which are stored in the demodulator output buffer DOB relate to a group of 1536 carriers at the input of the demodulator DEM which are successive in frequency. In other words, the offset value OFV effectively defines which portion of the frequency spectrum at the input of the demodulator DEM is effectively used for reception. Preferably, the offset value OFV is such the selected portion of the frequency spectrum includes all carriers of the received DAB transmission signal. For example, some automatic frequency control circuitry (not shown) may be used to adjust the offset value OFV for best reception.

A relevant carrier detector RCD determines for each 11-bit number in the offsetted carrier number sequence if it falls in a pre-determined numerical range. If so, the relevant carrier detector provides an enable signal EN(DOB) which enables the write of a metric which is present at the input of the demodulator output buffer DOB at that time. If not, the metric is not written into the demodulator output buffer DOB and, consequently, not used for further processing.

A read only memory ROM translates offsetted carrier number sequences into sequences of 11-bit address portions. To that end, the offsetted carrier number sequences are supplied to the address input of the read only memory ROM. In the read only memory ROM the complement of the frequency interleaving pattern FIP illustrated in FIG. 1$d$ is stored. In other words, for each metric pair derived from a relevant carrier there is an 11-bit address portion which is stored in the read only memory ROM and which indicates to which bit-combination in the group of N bit-combinations bc(1) . . . bc(N) at the transmitter end shown in FIG. 1$c$ the metric pair relates.

An adder ADD2 provides 12-bit write addresses by alternately increasing each two clock cycles the 11-bit address portions with a fixed value FV. The 12-bit write addresses indicate to which bit in the group of 2N successive bits b(1) . . . b(2N) at the transmitter end shown in FIG. 1$b$ a metric relates. The alternate increase of the 11-bit address portions is realised as follows. The least significant bit <1> of the count sequence provided by the counter CNT1 is supplied to a selector SEL2 which has 0 value at its 0-input and the fixed value FV at its 1-input. The fixed value FV depends on the DAB-mode and is identical to the numbers of carriers in the relevant mode. In mode I, for example, FV=1536.

The 12-bit write addresses provided by the adder ADD2 are applied at the 1-input of a selector SEL1.

Referring now to the lower part B of the block diagram shown in FIG. 8. The lower part B generates 12-bit addresses for the demodulator output buffer DOB, which addresses are applied to the 0-input of the selector SEL1. The 6 most significant bits of these 12-bit addresses are provided by a counter CNT2. The 6 least significant bits are provided by a counter CNT3.

The counter CNT2 counts from 0 to 47 between two metric bursts to indicate the metric transfer cycle number. To that end, the counter CNT2 is incremented each 233 clock cycles in response to a control signal MTS which indicates the start of a metric transfer cycle. Hence, the 6 output bits of counter CNT2 are the binary representation of the metric cycle transfer number. These 6 output bits are supplied to the 0-input of the selector SEL1 as the 6 most significant address bits for the demodulator output buffer DOB.

The counter CNT3 starts counting from 0 to 127 at the start of a metric transfer cycle. When this 0-to-127 count cycle is completed, the counter CNT3 starts counting from 0 to 63. The count rate of counter CNT3 is determined by the clock signal CK. That is, in both count cycles counter CNT3 is incremented each clock cycle. The 0-to-127 count cycle corresponds to the first part of the metric transfer cycles MTC(.), the 0-to-63 count cycle corresponds to the second part, see also FIG. 7.

An output selector OSL which is coupled to the output of the counter CNT3 determines which output bits of the counter CNT3 are applied to the 0-input of the selector SEL1. The 6 bits following the least significant bit of the 0-to-127 count cycles are applied to the 0-input of selector SEL1. Hence, during the first part of the metric transfer cycles there are 64 addresses, every two clock cycles a new address. On the other hand, all 6 bits of the 0-to-63 count cycles are supplied to the 0-input of the selector SEL1. Hence, during the second part of the metric transfer cycle 64 addresses identical to those in the first part are generated, only now at double rate: each clock cycle a new address.

A selector SEL3 provides a read/write control signal R/W(DOB) which determines whether the demodulator output buffer DOB is in the read or the write mode during the first two parts of the metric transfer cycles. The selector SEL3 receives the least significant output bit of counter CNT3 at its 1-input and a fixed value 1 at its 0-input. During the 0-to-127 count cycle of counter CNT3 the 1-input of the selector SEL3 is selected. In that case, the least significant output bit <1> of the counter CNT3 alternately sets the demodulator output buffer DOB in the read and write mode each clock cycle. During the 0-to-63 count cycle the 0-input is selected to set the demodulator output buffer in the read mode. The selector SEL3 is controlled by a control signal MTP. A time base circuit TBC provides the two control signals MTS and MTP which indicate the start of metric transfer cycles and the parts of the metric transfer cycles, respectively. The time base circuit TBC derives these signals from the start of burst signal SOB, the clock signal CK and an end of count cycle ECC signal from counter CNT3. Constructional details of the time base circuit are not discussed, since those skilled in the art can readily provide suitable time base circuits comprising counters and logic circuits, for example.

In summary, a DAB receiver has been presented in which a DAB transmission signal (RF) is supplied to a demodulator (DEM) which provides demodulation samples (me(.)). The demodulation samples (me(.)) are de-interleaved in a first section of a de-interleaving memory (TDM(1)). After having been de-interleaved, demodulation samples are transferred to a second section of the de-interleaving memory TDM(2)). This transfer (64 mi{TDM(1)→DOB}, 64 mi{DOB→TDM(2)}) is effectuated in bursts via a relatively small buffer DOB which stores the bursts. The second section of the de-interleaving memory TDM(2) effectively constitutes a relatively large buffer. De-interleaved demodulations samples are regularly read (mf{TDM(2)→IOB}) from the second section and supplied as a regular stream (DD) to a Viterbi decoder (DEC) by means of a relatively small first-in first-out register (IOB).

As to some notable aspects of the invention, the following remarks are made with reference to the embodiment shown in FIG. 2 which has now been discussed in great detail.

Generally speaking, the bursty data processing and data transfer, illustrated in FIGS. 5a to 5e and FIG. 7, obviates in many cases hard-ware parallelism. For example, the demodulation output buffer DOB, which has a relatively small storage capacity, performs various tasks in time multiplex.

The time de-interleaving memory TDM can be a standard 4×256 kbit DRAM, which is a relatively low-cost memory. Only two relatively small buffers are needed in between the demodulator DEM and the Viterbi decoder DEC: demodulator output buffer DOB and de-interleaver output buffer IOB. These buffers can be part of one integrated circuit, which further comprises the Viterbi decoder DEC and a part of the controller CON, for example. This integrated circuit then processes, together with the standard DRAM de-interleaving memory TDM, the demodulation samples provided by the demodulator DEM, which can be placed on an other integrated circuit.

While a limited number of examples were shown and described, a person skilled in the art may conceive many alternatives without departing from the scope of the invention claimed. The invention can be carried out by dedicated hardware or by a suitably programmed microprocessor.

The principle of the invention can also be used in receivers other than DAB receivers. For example, in receivers for terrestrial digital video broadcast (DVB) transmission according to an OFDM-type modulation.

The receiver described with reference to the drawings is also capable of receiving DAB signals other than mode I. Only some parameters need to change in accordance with the mode. For example, for mode II reception the sample groups SG(.) stored in the demodulation input buffer DIB comprise 512 complex samples, as do the sample bursts SB(.) provided by said buffer. Further, the demodulator DEM effectuates a 512 points complex fast Fourier transform and outputs bursts MB(.) of 1024 metrics, that is, 512 metric pairs. A number of 384 relevant metric pairs are selected and stored in the demodulation output buffer DOB.

It is evident that for mode II the time scale as shown in FIGS. 5a to 5e changes likewise. The writing in the demodulation input buffer DIB takes 6 times 512 clock cycles, the reading 512 clock cycles. The duration of the metric bursts is 1024 clock cycles in mode II. Since in mode II the modulation duration T(mod) corresponds to 3832 clock cycles, there are 2804 clock cycles available for 12 metric transfer cycles between two metric bursts.

Further, the control circuitry for the demodulation output buffer DOB shown in FIG. 8 can also be used for reception of DAB modes other than mode I. For example, in mode II the counter CNT1 is made to count from 0 to 1023, that is a 10-bit count. The bit-reversal section adjusted to bit-reverse all but the least significant bit of this 10-bit count. Further, the fixed value is made 384 for mode II, the offset value and relevant carrier detector are adjusted in accordance with number of carriers in mode II. The counter CNT2 is made to count from 0 to 11.

The input section INS of which an example is shown in FIG. 3 can be implemented in numerous different ways. For example, an input section of the type described in U.S. Pat. No. 5,230,011 can be used. In such an input section DAB transmission signal is digitized prior to a split-up in-phase and quadrature components. Digital circuitry effectuates the complex frequency shift to zero frequency is. It is further noted that the European patent application 94202518.0 (U.S. Ser. No. 08/523,704 filed Sep. 5, 1995) describes an advantageous modification to the input section described in U.S. Pat. No. 5,230,011.

Any reference signs in brackets appearing in the claims cannot be construed as limiting the claim.

We claim:

1. A receiver for receiving a transmission signal including an interleaved multiplex of encoded data-streams, the receiver comprising:
   a demodulator for providing demodulation samples;
   a de-interleaving memory for de-interleaving the demodulation samples;
   a decoder for providing a received data-stream in response to de-interleaved demodulation samples supplied thereto;
   a buffer with means for transferring de-interleaved demodulation samples from a first section of the de-interleaving memory to a second section of the de-interleaving memory; and
   a further buffer with means for transferring de-interleaved demodulation samples from the second section of the de-interleaving memory to the decoder as a regular stream.

2. A receiver as defined in claim 1, wherein the buffer is coupled between the demodulator and the de-interleaving memory for transferring demodulation samples from the demodulator to the first section of the de-interleaving memory.

3. A receiver as defined in claim 1, further comprising control means for effectuating transfers between buffer and the de-interleaving memory in cycles which comprise a capacity unit.

4. A method of receiving a transmission signal including an interleaved multiplex of encoded data-streams, the method comprising the steps of:

demodulating the transmission signal to obtain demodulation samples;

de-interleaving the demodulation samples in a first section of a de-interleaving memory;

transferring de-interleaved demodulation samples from the first section of the de-interleaving memory to a second section of the de-interleaving memory;

transferring de-interleaved demodulation samples from the second section of the de-interleaving memory to the decoder as a regular stream; and decoding the regular stream of de-interleaved demodulation samples to obtain a received data stream.

5. A receiver as defined in claim 2, further comprising control means for effectuating transfers between the buffer and the de-interleaving memory in cycles which comprise a capacity unit.

* * * * *